United States Patent
Lin et al.

(10) Patent No.: US 7,773,384 B2
(45) Date of Patent: Aug. 10, 2010

(54) THERMAL MODULE

(75) Inventors: Tzu-Wei Lin, Taipei (TW); Jui-Yi Lin, Taipei (TW); Kuan-Ying Lu, Taipei (TW); Chien-Yi Li, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 15 days.

(21) Appl. No.: 12/358,211

(22) Filed: Jan. 22, 2009

(65) Prior Publication Data
US 2009/0190313 A1    Jul. 30, 2009

(30) Foreign Application Priority Data
Jan. 30, 2008   (TW) ................ 97103469 A

(51) Int. Cl.
H05K 7/20 (2006.01)
H01L 23/34 (2006.01)

(52) U.S. Cl. ............... 361/719; 257/718; 257/719; 361/694; 361/695

(58) Field of Classification Search ......... 257/718–719; 361/719
See application file for complete search history.

(56) References Cited

U.S. PATENT DOCUMENTS

| | | | |
|---|---|---|---|
| 5,493,475 A * | 2/1996 | Lin | 361/710 |
| 6,193,205 B1 * | 2/2001 | Wang | 248/510 |
| 6,243,267 B1 * | 6/2001 | Chuang | 361/704 |
| 6,343,017 B1 * | 1/2002 | Yu et al. | 361/704 |
| 6,419,008 B1 * | 7/2002 | Wu | 165/80.3 |
| 6,419,514 B1 * | 7/2002 | Yu | 439/342 |
| 6,450,248 B1 * | 9/2002 | Chang | 165/80.3 |
| 6,470,962 B1 * | 10/2002 | Pao | 165/80.3 |
| 6,574,109 B1 | 6/2003 | McHugh et al. | |
| 6,618,253 B1 | 9/2003 | Szu et al. | |
| 6,781,838 B2 | 8/2004 | Shinotou | |
| 6,982,875 B2 | 1/2006 | Shinotou | |
| 7,019,978 B2 * | 3/2006 | Zhou et al. | 361/704 |
| 2004/0257771 A1 | 12/2004 | Shinotou | |

* cited by examiner

*Primary Examiner*—Gregory D Thompson
(74) *Attorney, Agent, or Firm*—Jianq Chyun IP Office

(57) ABSTRACT

A thermal module includes a heat sink disposed on a contact surface of the heat source, a mounting bracket having first and second ends, a fastening member, a pressing member, and at least one clip. The mounting bracket surrounds the heat source. The first end has at least one latch portion. The second end has at least one mounting slot and at least one first opening in communication with the mounting slot. The fastening member is slidably mounted in the mounting slot. The clip spans the heat sink and has two ends respectively engaged with the latch portion and a portion of the fastening member respectively. The pressing member includes a pressing tightly engaged with the clip and urges the heat sink when an operation portion of the pressing member is rotated from the first predetermined position to the second predetermined position.

12 Claims, 5 Drawing Sheets

THERMAL MODULE

CROSS-REFERENCE TO RELATED APPLICATION

This application claims the priority benefit of Taiwan application serial no. 97103469, filed on Jan. 30, 2008. The entirety of the above-mentioned patent application is hereby incorporated by reference herein and made a part of specification.

BACKGROUND OF THE INVENTION

1. Field of the Invention

The present invention generally relates to a thermal module, and more particularly, to a thermal module that can be easily assembled or removed.

2. Description of Related Art

Following the rapid advance of technology, the operating speed of electronic devices, such as the central processing unit (CPU) of a computer device, has been continuously increased in recent years. As the operating speed increases, the amount of heat generated by the CPU is increased accordingly. To prevent temporary or permanent failure of the computer device due to overheat, the computer device must have sufficient heat dissipating capacity to ensure the CPU to normally operate. To remove the heat generated by the CPU during high speed operation to thereby ensure a normal state of the CPU during high speed operation, a thermal module is typically directed disposed on the CPU (or a heat generating chip) such that the heat generated by the CPU can be quickly dissipated through the thermal module.

It should be noted that the conventional thermal module is generally securely assembled on the CPU by screws. Therefore, the period of the assembly of the thermal module on the CPU would be time-consuming. Certainly, it is also time-consuming to remove the thermal module from the CPU for repair or cleaning. In addition, the user cannot assemble the thermal module to or remove the thermal module from the CPU without using an appropriate tool. Therefore, it is inconvenient to assemble and remove the thermal module.

SUMMARY OF THE INVENTION

Accordingly, the present invention is directed to a thermal module including a heat sink that can be conveniently assembled to or removed from a heat source on a circuit board.

The present invention provides a thermal module for cooling a heat source on a circuit board. The thermal module includes a heat sink disposed on a contact surface of the heat source, a mounting bracket, a fastening member, a pressing member, and at least one clip. The mounting bracket is disposed on the circuit board and surrounds the heat source. The mounting bracket has a first end and a second end positioned on two opposite sides of the heat source. The first end has at least one latch portion. The second end has at least one mounting slot and at least one first opening in communication with the mounting slot. The fastening member is slidably mounted in the mounting slot and has at least one notch selectively corresponding to the first opening. The clip spans the heat sink and has two ends engaged with the latch portion and a portion of the fastening member excluding the notch through the first opening, respectively. It's noticed that when the notch corresponding to the first opening, a passage of the end of the clip adapted for engaging with the fastening member is then allowed. The pressing member includes a pressing portion and an operation portion. The pressing portion is configured to be pivotably mounted to the heat sink for pivoting about a rotary axis. The operation portion is configured to be rotated from a first predetermined position to a second predetermined position. The pressing portion is tightly engaged with the clip and urges the heat sink when the operation portion is rotated from the first predetermined position to the second predetermined position.

According to one embodiment of the present invention, the second end of the mounting bracket includes at least one guide portion, the fastening member includes a guide rail, and the guide portion is disposed on a movement path and engaged with the guide rail.

According to one embodiment of the present invention, when the pressing member is rotated from the first predetermined position to the second predetermined position, the thickness of the pressing portion in a direction perpendicular to the contact surface is changed from a first thickness to a second thickness larger than the first thickness.

According to one embodiment of the present invention, each of the two ends of the clip forms a catch, and the catches are engaged with the latch portion of the first end and a portion of the fastening member excluding the notch through the first opening, respectively. It's noticed that when the notch corresponding to the first opening, a passage of the catch of the clip adapted for engaging with the fastening member is then allowed.

According to one embodiment of the present invention, the pressing member further includes a second opening between the pressing portion and the operation portion, and the clip extends through the second opening to engage with the latch portion and the portion of the fastening member excluding the notch through the first opening, respectively.

The present invention also provides a thermal module for cooling a heat source on a circuit board. The thermal module includes a heat sink disposed on a contact surface of the heat source, a first mounting bracket, a second mounting bracket, a fastening member, a pressing member, and at least one clip. The first mounting bracket is disposed on the circuit board and has at least one latch portion. The second mounting bracket is disposed on the circuit board. The first mounting bracket and the second mounting bracket are disposed on two opposite sides of the heat source. The second mounting bracket has a mounting slot and at least one first opening in communication with the mounting slot. The fastening member is slidably mounted in the mounting slot and has at least one notch selectively corresponding to the first opening. The clip spans the heat sink and has two ends respectively engaged with the latch portion and a portion of the fastening member excluding the notch through the first opening, respectively. It's noticed that when the notch corresponding to the first opening, a passage of the end of the clip adapted for engaging with the fastening member is then allowed. The pressing member includes a pressing portion and an operation portion. The pressing portion is configured to be pivotably mounted to the heat sink for pivoting about a rotary axis. The operation portion is configured to be rotated from a first predetermined position to a second predetermined position. The pressing portion is tightly engaged with the clip and urges the heat sink when the operation portion is rotated from the first predetermined position to the second predetermined position.

According to one embodiment of the present invention, the second mounting bracket includes at least one guide portion, the fastening member includes a guide rail, and the guide portion is disposed on a movement path and engaged with the guide rail.

According to one embodiment of the present invention, when the pressing member is rotated from the first predetermined position to the second predetermined position, the thickness of the pressing portion in a direction perpendicular to the contact surface is changed from a first thickness to a second thickness larger than the first thickness.

According to one embodiment of the present invention, each of the two ends of the clip forms a catch, and the catches are engaged with the latch portion of the first mounting bracket and a portion of the fastening member excluding the notch through the first opening, respectively.

According to one embodiment of the present invention, the pressing member further includes a second opening between the pressing portion and the operation portion, and the clip extends through the second opening to engage with the latch portion and the portion of the fastening member excluding the notch through the first opening, respectively.

In the thermal module of the present invention, the clip spans the heat sink and has two ends respectively engaged with the mounting bracket and a fastening member extending into the mounting bracket, respectively. Simply by rotating the pressing member from a first predetermined position to a second predetermined position, the pressing member can be tightly engaged with the clip and the pressing portion exerts a pressing force on the heat sink, thereby making the heat sink closely contact with the heat source to cool the heat source.

In addition, when it is desired to remove the heat sink of the thermal module from the heat source, the user can simply move the fastening member to disengage the clip from the fastening member and the heat sink can then be easily and conveniently removed from the heat source. It is recognized, however, the user may also rotate the pressing member back to its original position and remove the clip and the heat sink can then be conveniently removed from the heat source. In other words, the heat sink of the thermal module can be easily assembled to or removed from the heat source.

In order to make the aforementioned and other features and advantages of the present invention more comprehensible, embodiments accompanied with figures are described in detail below.

DESCRIPTION OF THE EMBODIMENTS

Figure 1A:
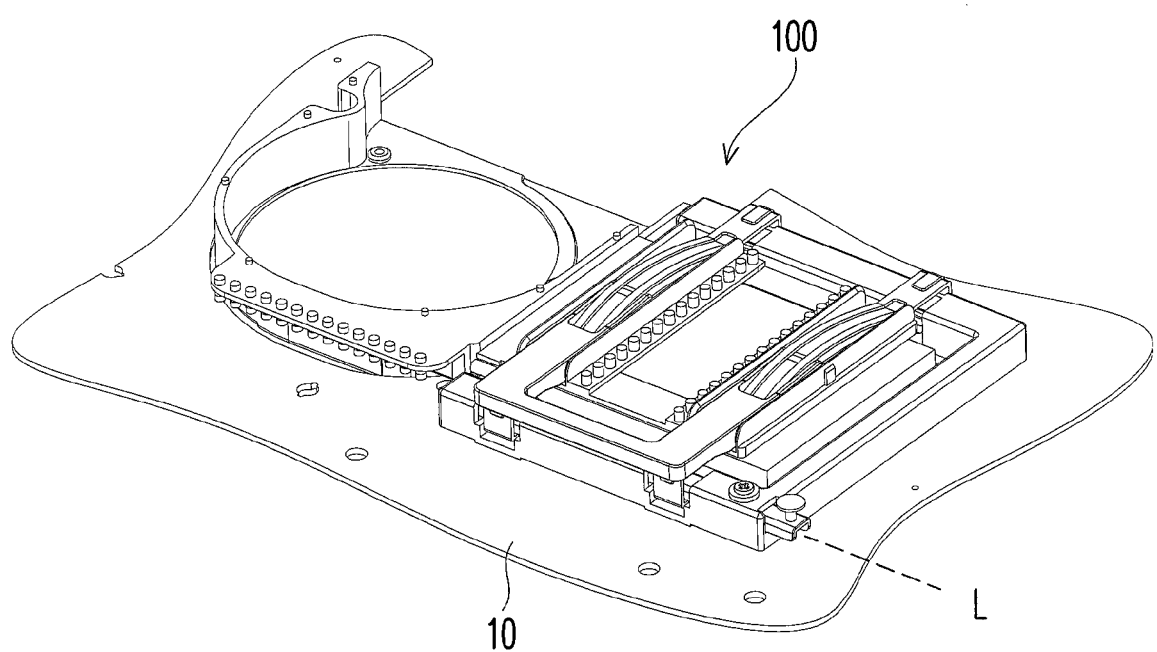
FIG. 1A illustrates a thermal module mounted on a heat source of a circuit board according to one embodiment of the present invention.
Figure 1B:
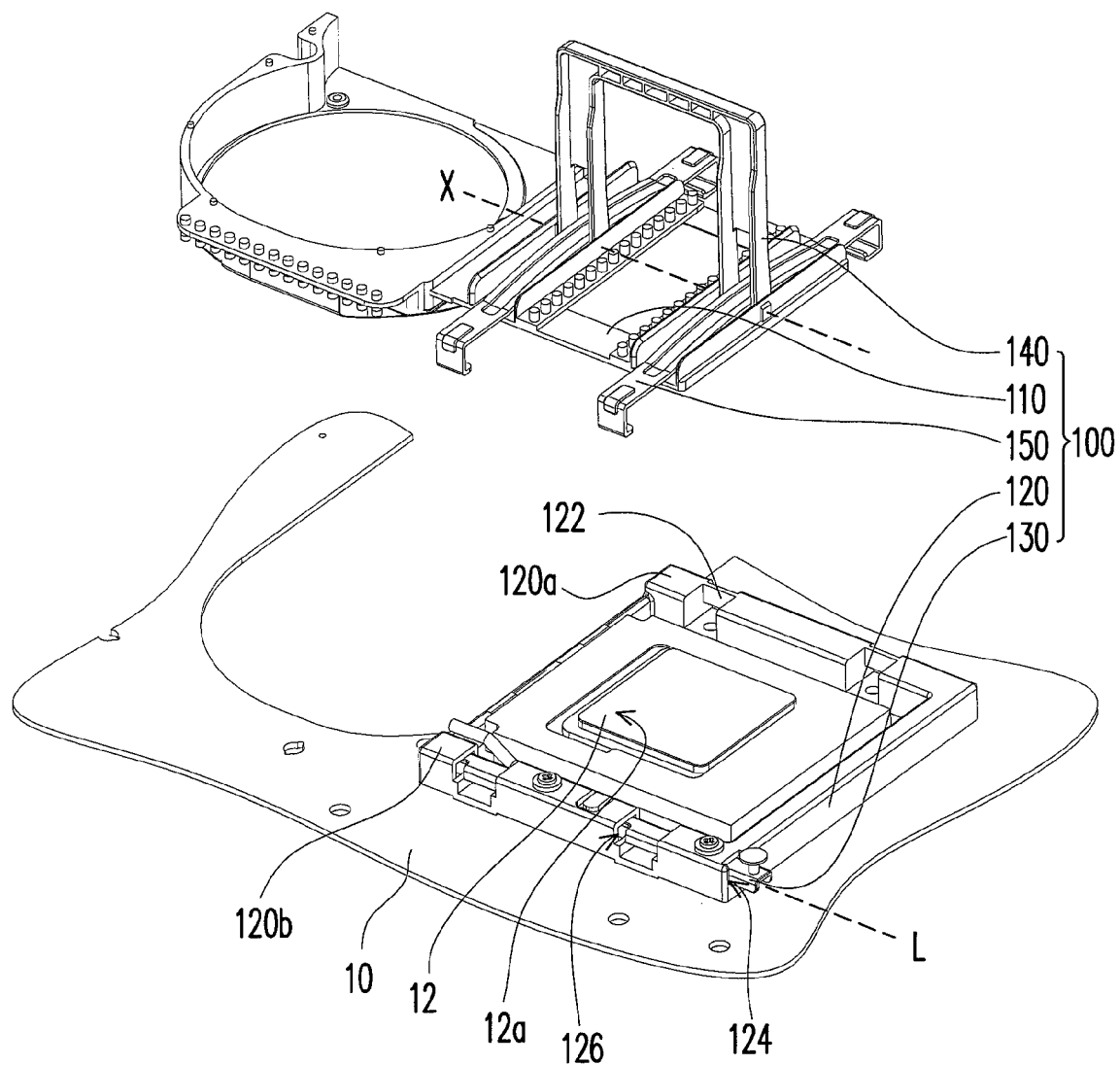
FIG. 1B is a partially exploded view of the thermal module and the circuit board of FIG. 1A.

FIG. 1A illustrates a thermal module assembled on a heat source of a circuit board according to one embodiment of the present invention. FIG. 1B is a partially exploded view of the thermal module and the circuit board of FIG. 1A. Referring to FIGS. 1A and 1B, the thermal module 100 of the present embodiment is suitable for being disposed on a heat source 12 of a circuit board 10 to cool the heat source 12. The thermal module 100 includes a heat sink 110 that can be easily assembled to or removed from the heat source 12. The structure of the thermal module 100 and how the heat sink 110 is assembled to or removed from the circuit board 10 are described in detail below.

Figure 2:
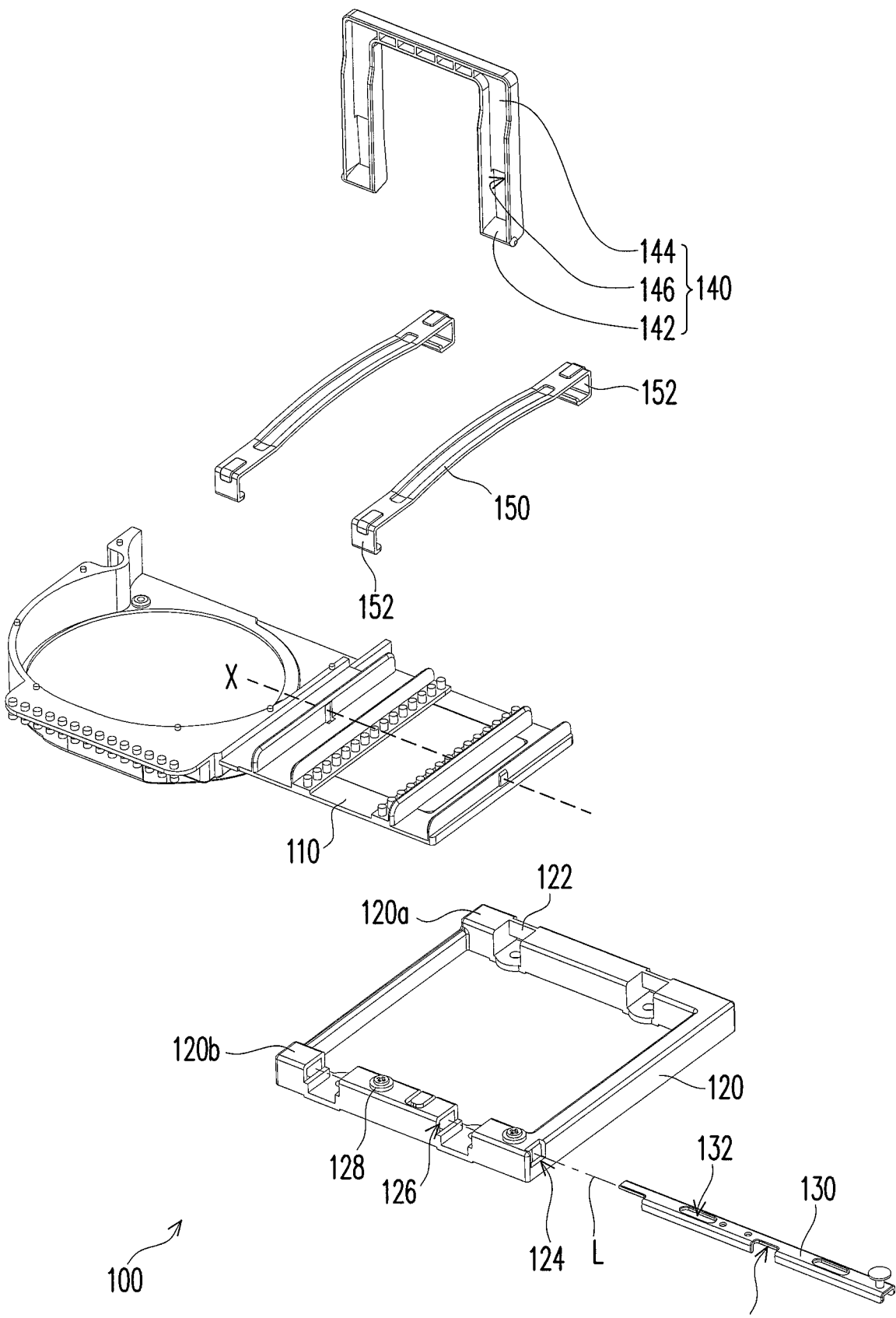
FIG. 2 is an exploded view of the thermal module of FIG. 1A.

FIG. 2 is an exploded view of the thermal module of FIG. 1A. Referring to FIG. 1B and FIG. 2, the thermal module 100 of the present embodiment mainly includes the heat sink 110 disposed on a contact surface 12a of the heat source 12, a mounting bracket 120, a fastening member 130, a pressing member 140, and at least one clip 150 (two clips 150 are illustrated in the present embodiment). In the present embodiment, the mounting bracket 120 is disposed on the circuit board 10 and surrounds the heat source 12. The mounting bracket 120 of the present embodiment has a first end 120a and a second end 120b positioned at opposite two sides of the heat source 12, respectively. The first end 120a has at least one latch portion 122 (two latch portions are illustrated in the present embodiment). The second end 120b has a mounting slot 124 and a first opening 126 in communication with the mounting slot 124 (two first openings 126 are illustrated in the present embodiment).

In addition, the fastening member 130 of the present embodiment is, for example, slidably mounted in the mounting slot 124 and move along a movement path L. The first opening 126 of the second end 120b of the mounting bracket 120 exposes a portion of the fastening member 130. The second end 120b of the mounting bracket 120 includes, for example, a guide portion 128, and the fastening member 130 includes a guide rail 132. In the present embodiment, the guide portion 128 is disposed along the movement path L and engaged with the guide rail 132. As such, with the engagement of the guide portion 128 with the guide rail 132, the fastening member 130 can stably slide along the movement path L in the mounting slot 124.

Besides, the pressing member 140 is, for example, pivotably mounted to the heat sink 110 for pivoting about a rotary axis X. The pressing member 140 includes a pressing portion 142 and an operation portion 144 with a second opening 146 formed between the pressing portion 142 and the operation portion 144. The clip 150, for example, extends through the second opening 146 and spans the heat sink 110. In the present embodiment, a catch 152 is formed on each of two ends of each clip 150. The two catches 152 of each clip 150 are engaged with the latch portion 122 of the first end 120a of the mounting bracket 120 and a portion of the fastening member 130 excluding the notch 134 through the first opening 126, respectively. It's noticed that when the notch 134 corresponding to the first opening 126, a passage of the end of the clip 150 adapted for engaging with the fastening member 130 is then allowed.

It is also noted that a user can rotate the operation portion 144 to rotate the pressing member 140 about the rotary axis X from a first predetermined position to a second predetermined position. The rotation of the pressing member 140 causes the pressing portion 142 to tightly engage the clip 150 and to urge the heat sink 110 to closely contact with the heat source 12. The assembly of the heat sink 110 is described in detail below in cross-sectional views.

Figure 3A:
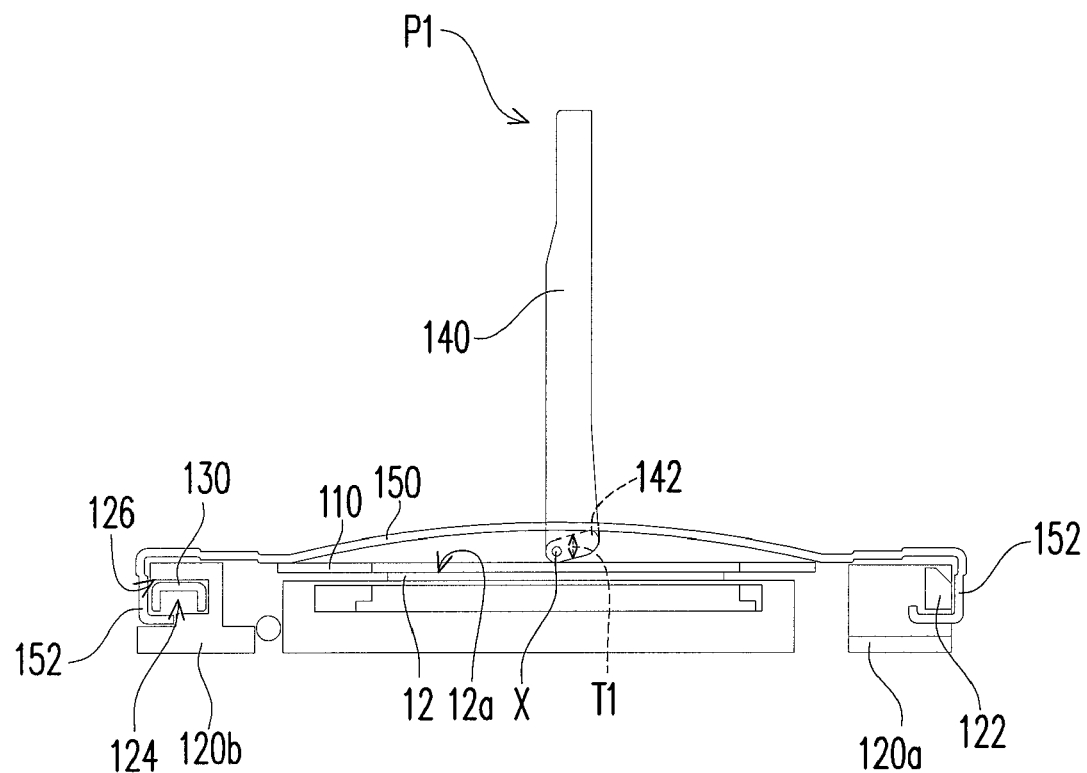
FIGS. 3A through 3B are cross-sectional views illustrating the assembly of the heat sink of FIG. 1A on the heat source.
Figure 3B:
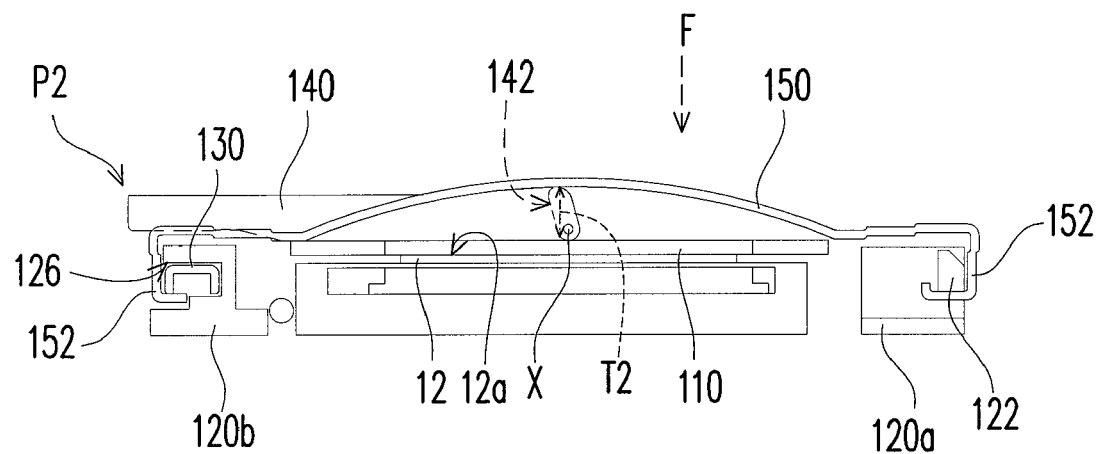

FIGS. 3A through 3B are cross-sectional views illustrating the assembly of the heat sink of FIG. 1A on the heat source. Referring to FIG. 3A (the heat sink 110 of FIG. 3A has not been mounted onto the heat source 12), in the present embodiment, the heat sink 110 is first disposed on the heat source 12, with the catches 152 of the two ends of each clip 152 being engaged with one latch portion 122 of the first end 120a of the mounting bracket 120 and a portion of the fastening member 130 excluding the notch 134 through the first opening 126, respectively. It's noticed that when the notch 134 corresponding to the first opening 126, a passage of the end of the clip 150 adapted for engaging with the fastening member 130 is then allowed. The pressing member 140 of FIG. 3A is, for example, positioned at a first predetermined position P1, and the pressing portion 142 of the pressing member 140 has a first thickness T1 in a direction perpendicular to the contact surface 12a. At this position, the pressing member 140 is loosely engaged with the clip 150, and the clip 150 is also loosely engaged with the fastening member 130 and the latch portion 122 ("loosely engaged" used herein means not tightly engaged).

Referring to FIG. 3B, when the pressing member 140 is rotated about the rotary axis X from the first predetermined position P1 to a second predetermined position P2, the thickness of the pressing portion 142 of the pressing member 140 in the direction perpendicular to the contact surface 12a is changed from the first thickness T1 to a second thickness T2. The second thickness T2 is larger than the first thickness T1 such that the clip 150 extending through the pressing member 140 becomes tightly engaged with the fastening member 130 and the latch portion 122 under the act of the pressing portion 142. Consequently, the engagement of the clip 150 with the fastening member 130 and the latch portion 122 also causes the pressing portion 142 to exert a pressing force F on the heat sink 110, thereby making the heat sink 110 closely contact with the heat source 12 to cool the heat source 12.

After the assembly of the heat sink 110 is described above, the following is a detail description regarding removal of the heat sink 110. Referring to FIGS. 1A and 2, when the heat sink 110 is securely assembled on the heat source 12 to cool the heat source 12, the clip 150 is stably latched between the fastening member 130 and the latch portion 122. When it is desired to remove the heat sink 110 from the heat source 12 for repair or cleaning, the user can disengage the clip 150 from the fastening member 130 simply by moving the fastening member 130 along the movement path L and the heat sink 110 can then be readily removed from the heat source 12.

More specifically, in the present embodiment, at least one notch 134 (two recesses are illustrated in the present embodiment) can be formed in the second end 120b of the fastening member 130 corresponding to the catch 152. When the heat sink 110 is securely assembled on the heat source 12 to cool the heat source 12, the catch 152 of the clip 150 is engaged with the fastening member 130. When the user moves the fastening member 130 along the movement path L such that the notch 134 is moved to a position aligned with the catch 152, no engagement occurs between the catch 152 and the notch 134. That is, the catch 152 is no longer engaged with the fastening member 130, and the heat sink can thus be easily removed from the heat source 12. It should be understood that, in alternative embodiments of the present invention, the user can also directly withdraw the fastening member 130 from the mounting slot 124 to disengage the fastening member 130 from the clip 150, thereby facilitating the removal of the heat sink 110 from the heat source 12. In other words, the particulars described herein are not intended to limit the present invention, but rather, any design is considered within the spirit and scope of the present invention as long as the fastening member 130 is disengaged from the clip 150 to allow the heat sink 110 to be removed from the heat source 12.

Figure 4:
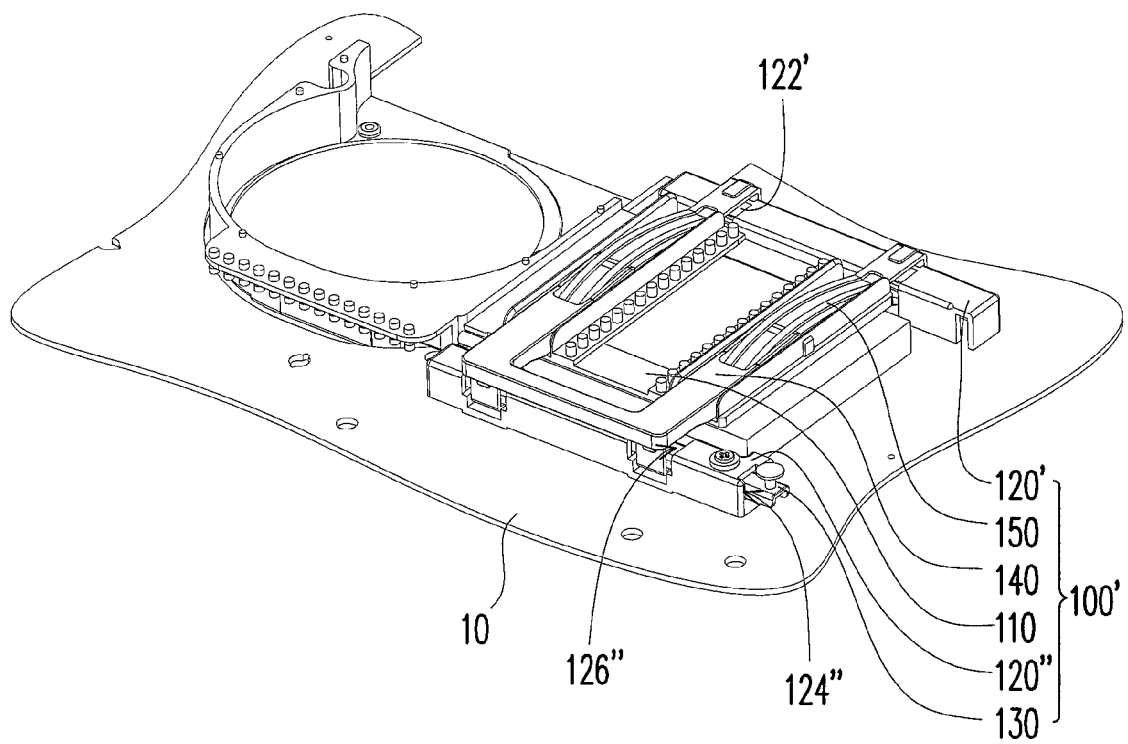
FIG. 4 illustrates a thermal module assembled on a heat source of a circuit board according to another embodiment of the present invention.

In the previous embodiment, the mounting bracket 120 disposed on the circuit board 10 is, for example, a rectangular structure. However, in another embodiment of the present invention, the function of the mounting bracket 120 can be instead realized by a first mounting bracket 120' and a second bracket 120" that are in the form of "▬▬▬▸", as illustrated in FIG. 4. FIG. 4 illustrates a thermal module assembled on a heat source of a circuit board according to another embodiment of the present invention. Referring to FIG. 4, the thermal module 100' is similar to the thermal module 100 except that the thermal module 100' of FIG. 4 employs a first mounting bracket 120' and a second bracket 120" that are, for example, in the form of "▬▬▬▸", to substitute for the mounting bracket 120 of the previous embodiment. Except for this difference, the construction of the thermal module 100' of the present embodiment is the same as that of the thermal module 100 of the previous embodiment.

As in the previous embodiment, the first mounting bracket 120' and the second mounting bracket 120" of the present embodiment are likewise disposed on the circuit board 10, and the first mounting bracket 120' and the second mounting bracket 120" are positioned on two opposite sides of the heat source. In addition, the first mounting bracket 120' likewise includes at least one latch portion 122', and the second mounting bracket 120" likewise includes a mounting slot 124" and at least one first opening 126" in communication with the mounting slot 124". The fastening member 130 is likewise slidably mounted in the mounting slot 124" for engagement with the clip 150. Most components of the thermal module 100' are the same as the components of the thermal module 100, and the manner of securing the heat sink 110 of the thermal module 100' to the heat source is the same as the manner of securing the heat sink 110 of the thermal module 100 and, therefore, these components and securing manner are not repeated herein.

In summary, in the thermal module of the present invention, the clip extends through the second opening of the pressing member and spans the heat sink, and the two ends of the clip are engaged with the mounting bracket and the fastening member extending into the mounting bracket, respectively. Simply by rotating the pressing member from a first predetermined position to a second predetermined position such that the thickness of the pressing portion in a direction perpendicular to the contact surface is changed from a first thickness to a second thickness larger than the first thickness, the clip can be tightly engaged with the fastening member and the latch portion under the act of the pressing portion. Consequently, the engagement of the clip with the fastening member and the latch portion causes the pressing portion to exert a pressing force on the heat sink, thereby making the heat sink closely contact the heat source to cool the heat source.

In addition, when it is desired to remove the heat sink of the thermal module from the heat source, the user can simply move the fastening member to disengage the clip from the fastening member and the heat sink can then be easily and conveniently removed from the heat source. In other words, the heat sink of the present invention can be readily assembled onto the heat source and removed from the heat source as well. It is recognized, however, the user may also rotate the pressing member from the second predetermined position to the first predetermined position where the clip is loosely engaged with the fastening member and the latch portion and the heat sink can then easily be removed from the heat source.

Different from the conventional heat sink which is assembled on the heat source with screws and requires an extra tool for assembly and removal thereof, the heat sink of the present invention can be easily and conveniently assembled or removed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thermal module for cooling a heat source on a circuit board, comprising:
    a heat sink disposed on a contact surface of the heat source;
    a mounting bracket disposed on the circuit board and surrounding the heat source, the mounting bracket having a first end and a second end positioned on two opposite sides of the heat source, the first end having at least one latch portion, the second end having at least one mounting slot and at least one first opening in communication with the mounting slot;
    a fastening member slidably mounted in the mounting slot and has at least one notch selectively corresponding to the first opening; and
    at least one clip spanning the heat sink and having one end engaged with the latch portion and another end engaged with a portion of the fastening member excluding the notch through the first opening.

2. The thermal module according to claim 1, further comprising:
    a pressing member including a pressing portion and an operation portion, the pressing portion configured to be pivotably mounted to the heat sink for pivoting about a rotary axis, the operation portion configured to be rotated from a first predetermined position to a second predetermined position, wherein the pressing portion is tightly engaged with the clip and urges the heat sink when the operation portion is rotated from the first predetermined position to the second predetermined position.

3. The thermal module according to claim 1, wherein the second end of the mounting bracket including at least one guide portion, the fastening member includes a guide rail, and the guide portion is disposed along a movement path and engaged with the guide rail.

4. The thermal module according to claim 2, wherein when the pressing member is rotated from the first predetermined position to the second predetermined position, the thickness of the pressing portion in a direction perpendicular to the contact surface is changed from a first thickness to a second thickness larger than the first thickness.

5. The thermal module according to claim 1, wherein each of the two ends of the clip forms a catch, and one of the catches is engaged with the latch portion of the first end and another one of the catches is engaged with the portion of the fastening member excluding the notch.

6. The thermal module according to claim 2, wherein the pressing member further includes a second opening between the pressing portion and the operation portion, and the clip extends through the second opening.

7. A thermal module for cooling a heat source on a circuit board, comprising:
    a heat sink disposed on a contact surface of the heat source;
    a first mounting bracket disposed on the circuit board and having at least one latch portion;
    a second mounting bracket disposed on the circuit board, the second mounting bracket and the first mounting bracket disposed on two opposite sides of the heat source, the second mounting bracket having a mounting slot and at least one first opening in communication with the mounting slot;
    a fastening member slidably mounted in the mounting slot and has at least one notch selectively corresponding to the first opening; and
    at least one clip spanning the heat sink and having one end engaged with the latch portion and another end engaged with a portion of the fastening member excluding the notch through the first opening.

8. The thermal module according to claim 7, further comprising:
    a pressing member including a pressing portion and an operation portion, the pressing portion configured to be pivotably mounted to the heat sink for pivoting about a rotary axis, the operation portion configured to be rotated from a first predetermined position to a second predetermined position, wherein the pressing portion is tightly engaged with the clip and urges the heat sink when the operation portion is rotated from the first predetermined position to the second predetermined position.

9. The thermal module according to claim 7, wherein the second mounting bracket includes at least one guide portion, the fastening member includes a guide rail, and the guide portion is disposed along a movement path and engaged with the guide rail.

10. The thermal module according to claim 7, wherein when the pressing member is rotated from the first predetermined position to the second predetermined position, the thickness of the pressing portion in a direction perpendicular to the contact surface is changed from a first thickness to a second thickness larger than the first thickness.

11. The thermal module according to claim 7, wherein each of the two ends of the clip forms a catch, and one of the catches is engaged with the latch portion of the first end and another one of the catches is engaged with the portion of the fastening member excluding the notch.

12. The thermal module according to claim 7, wherein the pressing member further includes a second opening between the pressing portion and the operation portion, and the clip extends through the second opening.

* * * * *